(12) United States Patent
Chen

(10) Patent No.: US 7,643,352 B2
(45) Date of Patent: Jan. 5, 2010

(54) METHOD FOR ERASING FLASH MEMORY

(75) Inventor: Chung Zen Chen, Hsinchu (TW)

(73) Assignee: Elite Semiconductor Memory Technology Inc., Hsinchu (TW)

(*) Notice: Subject to any disclaimer, the term of this patent is extended or adjusted under 35 U.S.C. 154(b) by 102 days.

(21) Appl. No.: 12/132,153

(22) Filed: Jun. 3, 2008

(65) Prior Publication Data

US 2009/0296492 A1    Dec. 3, 2009

(51) Int. Cl.
*G11C 11/34* (2006.01)
(52) U.S. Cl. .............................. 365/185.29; 365/185.22
(58) Field of Classification Search ............ 365/185.29, 365/185.22, 185.03
See application file for complete search history.

(56) References Cited

U.S. PATENT DOCUMENTS

| | | | |
|---|---|---|---|
| 5,841,721 A | 11/1998 | Kwon et al. | |
| 5,954,828 A | 9/1999 | Lin | |
| 6,222,772 B1 | 4/2001 | Choi et al. | |
| 6,335,882 B1 * | 1/2002 | Saeki et al. ............ | 365/185.29 |
| 6,891,752 B1 * | 5/2005 | Bautista et al. ........ | 365/185.11 |
| 6,909,641 B2 * | 6/2005 | Naso et al. ............ | 365/185.33 |
| 7,130,240 B2 | 10/2006 | Chae et al. | |
| 7,382,650 B2 * | 6/2008 | Chang ................... | 365/185.11 |

* cited by examiner

*Primary Examiner*—Anh Phung
(74) *Attorney, Agent, or Firm*—Connolly Bove Lodge & Hutz LLP

(57) ABSTRACT

A method for erasing flash memory comprises the steps of: setting a critical ending condition; simultaneously erasing selected multiple sectors of the flash memory; stopping simultaneous erasing if one of the selected multiple sectors meets the critical ending condition; and erasing the remainder of each of the selected multiple sectors sequentially.

9 Claims, 4 Drawing Sheets

METHOD FOR ERASING FLASH MEMORY

BACKGROUND OF THE INVENTION

1. Field of the Invention

The present invention relates to a method for erasing flash memory, and more particularly, to a method for erasing flash memory without over erasing.

2. Description of the Related Art

In order to change data of the flash memory, the data within the flash memory should be erased first and then reprogrammed. U.S. Pat. No. 7,130,240 discloses a method for erasing sectors of a flash memory in sequence. However, such method is time-consuming and will not fulfill the current needs of the industry.

In addition, as the memory capacity of the flash memory increases, the time needed to erase will increase. To solve such problem, a technique for simultaneously erasing the selected memory blocks is required. However, the well-known issue of "slow bits" residing in each sector, which represent unsuccessfully erased bits after an erasing action, tend to slow down the entire process and reduce the reliability of the flash memory. The slow bits need greater than normal durations of erasing action to completely erase. At the same time, caution is needed to avoid other normal bits being redundantly erased, or "over erased." If normal bits are over erased, more time is needed to correct them, and sometimes it is impossible to recover data lost due to heavily over-erased sectors. U.S. Pat. No. 5,841,721 discloses a method to verify whether the erasure is successfully performed. To avoid over erasing, this method verifies the multiple sectors after one erasing action. However, this method will naturally consume a lot of time on erasing verification. For example, there is a flag for each block, and the flag indicates if the block is selected for erasure. Erasure is performed on all selected blocks that do not pass verification. However, if the selected block passes verification, the flag is reset and no further erasure is performed on this block. Verification is then performed on all selected and unsuccessfully erased blocks. If subsequent blocks pass verification, their flags are reset, and no further erasure is performed on these blocks.

U.S. Pat. No. 5,954,828 and U.S. Pat. No. 6,222,772 disclose another type of erasing methodology, which allows a number of failing bits and therefore some slow bits can be ignored. However, such method can only be applied on fault tolerant applications.

SUMMARY OF THE INVENTION

The above-mentioned problems are addressed by the present invention. The method of the present invention will be understood according to the disclosure of the following specification and drawings.

According to one embodiment of the present invention, the method for erasing a flash memory comprises the steps of: setting a critical ending condition; simultaneously erasing selected multiple sectors of the flash memory; stopping simultaneous erasing if one of the selected multiple sectors meets the critical ending condition; and erasing the remainder of each of the selected multiple sectors sequentially.

According to another embodiment of the present invention, the method for erasing a flash memory comprises the steps of: simultaneously erasing selected multiple sectors of the flash memory; verifying bits of one sector upon a predetermined condition; continually erasing selected multiple sectors of the flash memory simultaneously if the verification does not satisfy a critical ending condition; stopping simultaneous erasing if the verification satisfies the critical ending condition; and erasing the remainder of each of the selected multiple sectors sequentially.

BRIEF DESCRIPTION OF THE DRAWINGS

The invention will be described according to the appended drawings in which.

DETAILED DESCRIPTION OF THE INVENTION

Figure 1:
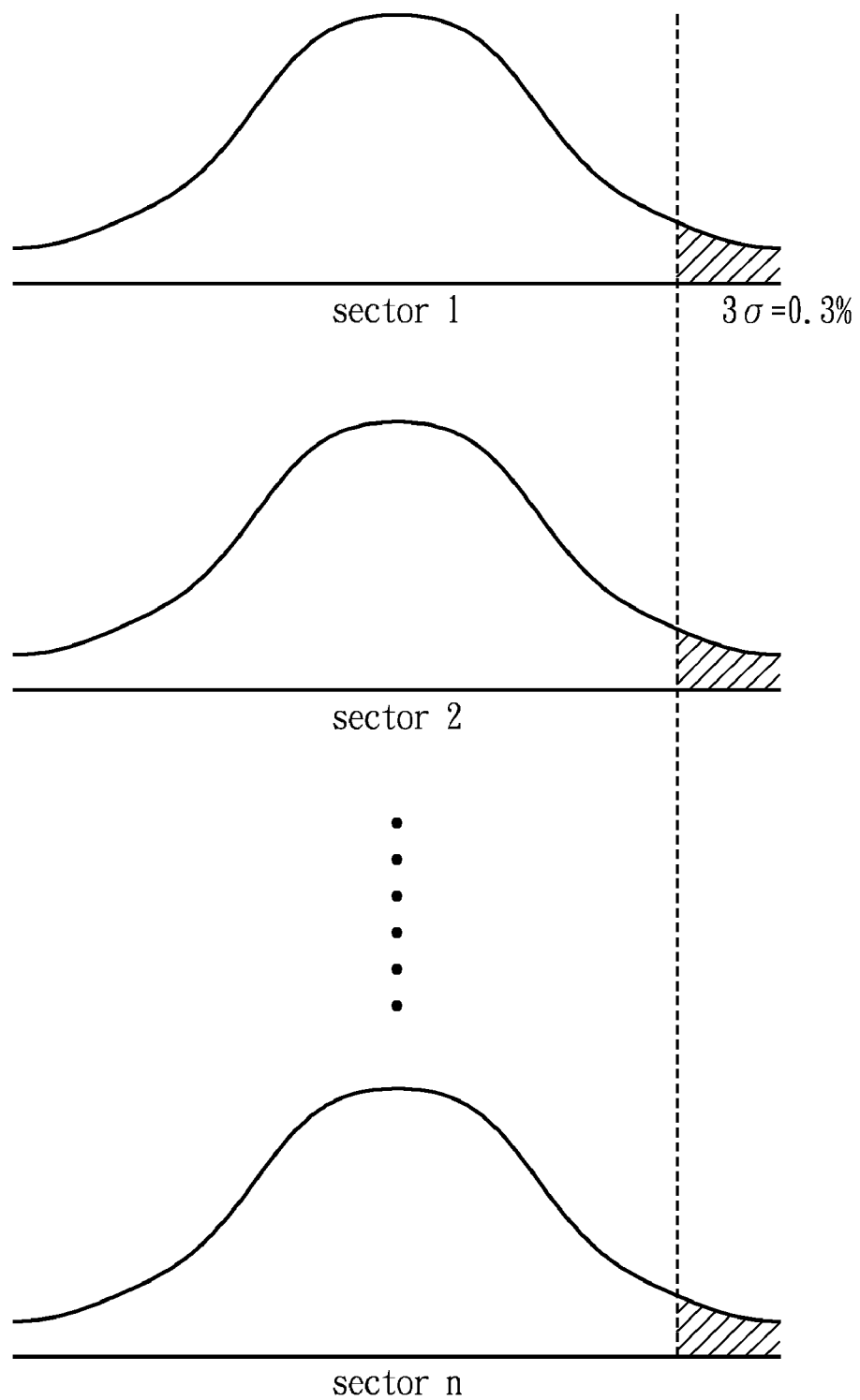
FIG. 1 shows a hint diagram of the present invention.

FIG. 1 shows a hint diagram of the present invention. To avoid over erasing, it is necessary to avoid erasing normal bits of the flash memory several times after the erasing action is done merely because slow bits in each sectors fail to pass the verification. Because each sector in a flash memory is manufactured with the same process, it can be reasonably assumed that the normal bits and slow bits in each sector are formed in the same normal distribution. Therefore, a threshold or critical ending condition such as $3\sigma=0.3\%$ is set to represent the region in which the slow bits may reside, where a represents a variance of the normal distribution.

In multiple sector erasure, erasing is commenced for all of the selected sectors. When most of the bits in the first sector that meets the critical ending condition have passed erasure verification, the other sectors will then stop erasing. Because the remainder of the unsuccessfully erased bits may include slow bits, the second step of the erasing action proceeds with the sequence of the selected sectors one by one.

Figure 2:
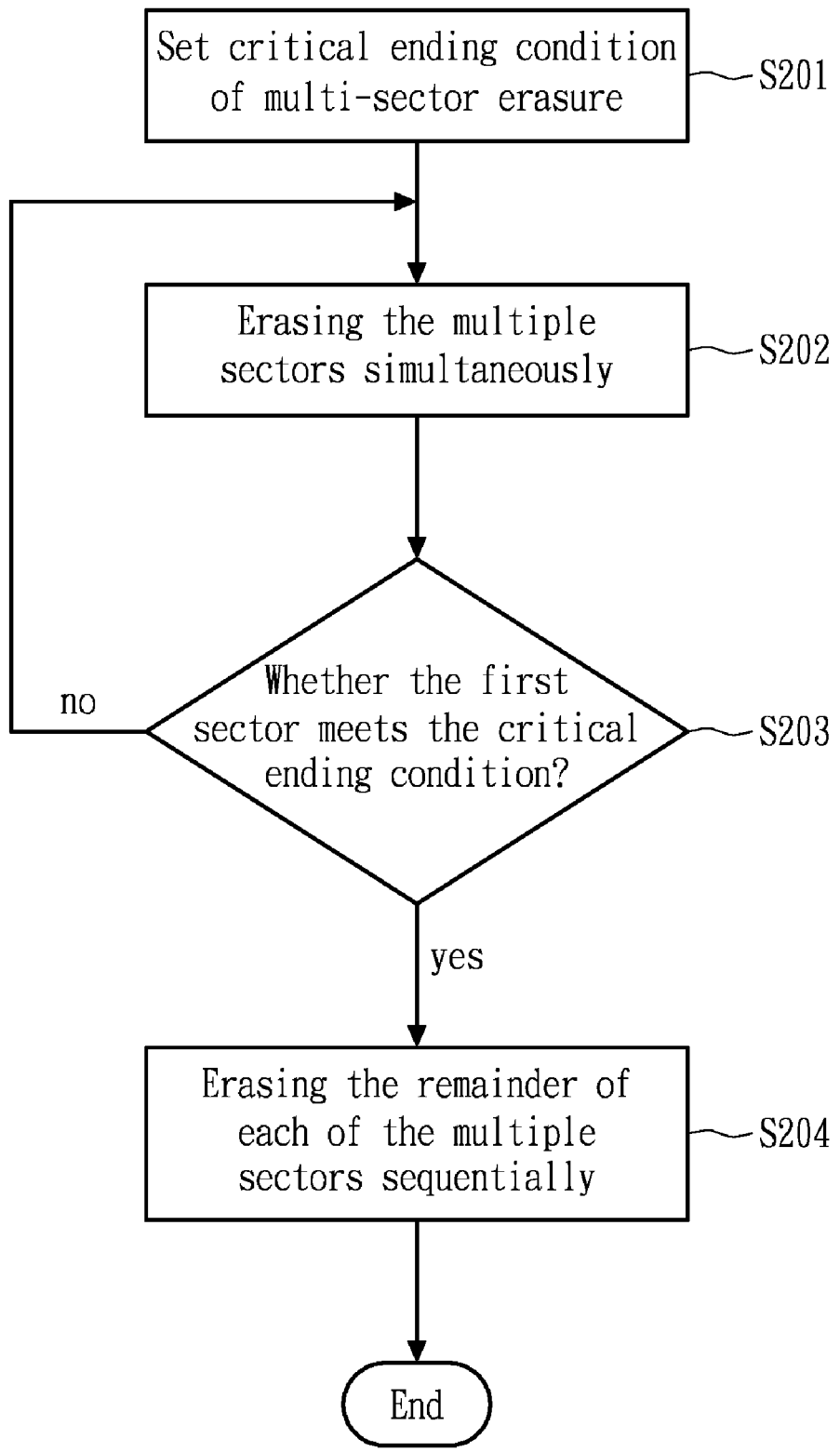
FIG. 2 shows a flow chart of the present invention.

FIG. 2 shows a flow chart of the present invention. In step S201, after the test mode is entered, a critical ending condition of the multi-sector erasure is set. In step S202, the multiple sectors are erased simultaneously. The present invention does not continuously monitor the passing rate of the first sector, but rather waits for an asserting value of a first counter, which represents the number of erasing actions performed. Therefore, the present invention may save a lot of time in conducting verification. However, if the verification is entered and finds that the passing rate of the first sector meets the critical ending condition, the concurrent erasing action will be stopped. Otherwise, the steps S202 and S203 iterate. The ideal critical ending condition can be determined by experiment or experience, and the critical ending condition is not limited to the passing rate. The record related to the critical ending condition, such as voltage potential and how many times to conduct the erasing actions, can be applied when erasing the other flash memories. In step S204, the remainder of each of the multiple sectors is erased in sequence. For example, the remainder of the first sector is erased first. Next, the remainder of the second sector is erased; then the third sector, and so on.

Figure 3A:
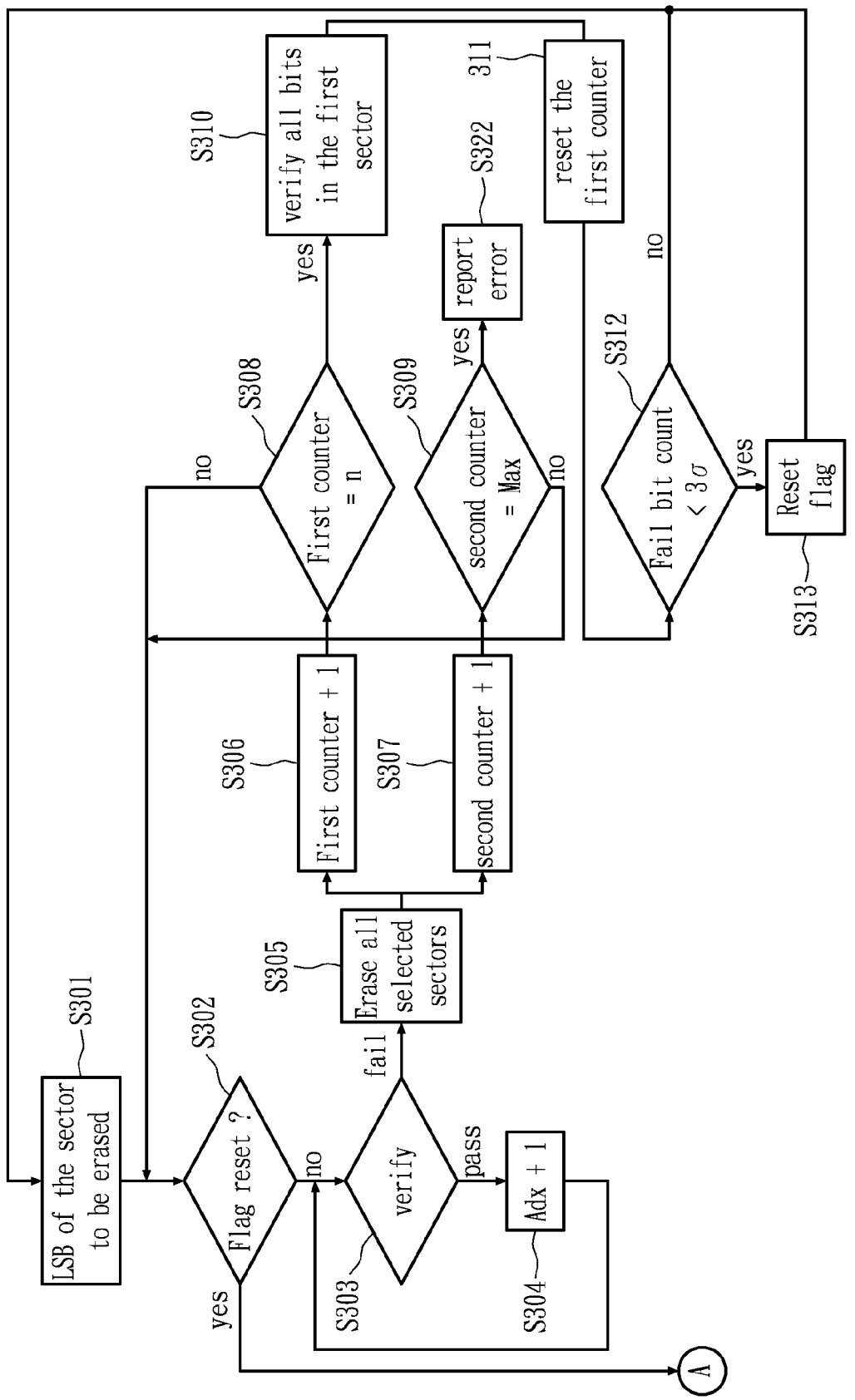
FIG. 3A shows a flow chart before the critical ending condition is met.

FIG. 3A shows a flow chart of the present invention. In step S301, the Least Significant Bit (LSB) positions of the sectors to be erased are located. A flag is used to indicate whether or not the critical ending condition is met. In step S302, if the flag is reset, then the flow goes to FIG. 3B; otherwise the flow keeps going between steps S303 and S304 to verify the content of the continuous addresses. Once a failure is reported, step S305 will erase all selected sectors. In step S306, a first counter is used to track the number of erasing actions performed. And if the number reaches a predetermined value such as "n," step S310 will verify all bits in the first sector, then step S311 resets the first counter. In step S312, if the failing bit count is less than a predetermined value, such as 3σ, which represents a critical ending condition, then step S313 resets the flag and goes back to step S301. In addition, a second counter tracks the number of failures. In step S309, if the content of the second counter reaches a maximum value, which represents a time-out signal, step S322 will report an error.

Figure 3B:
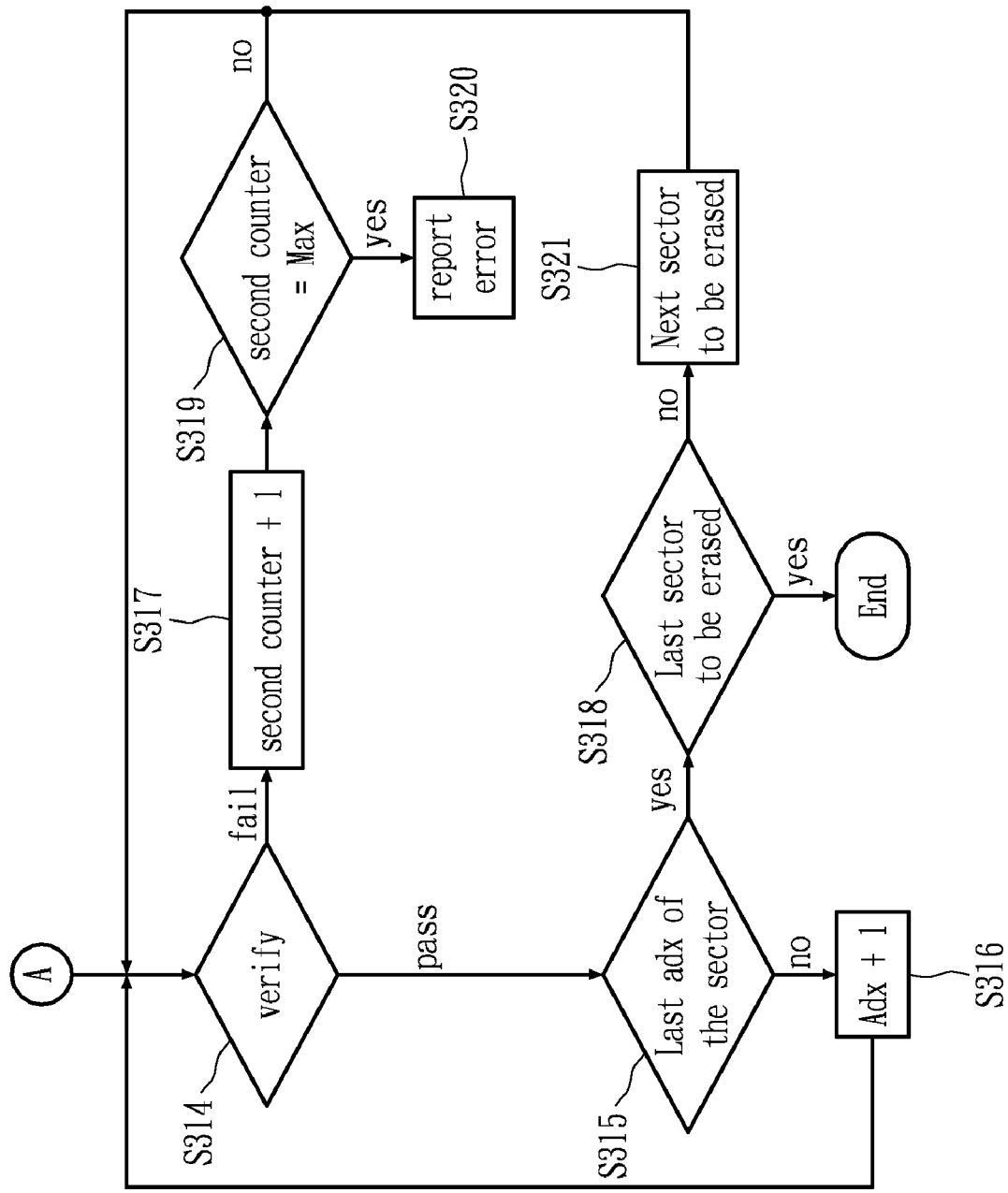
FIG. 3B shows a flow chart after the critical ending condition is met.

FIG. 3B shows the flow chart after the critical ending condition is met. Between steps S314 and S315, the remainder of the first sector only is continually verified until passing the test. Similarly, any failure during the test will increase the content of the second counter which tracks errors, as shown in step S320. If the content thereof reaches a maximum number, a time-out signal was asserted, as shown in step S319. If the first sector is verified successfully, then the process is applied to the second sector, then the third sector, and so on, as shown in steps S318 and S321.

The above-described embodiments of the present invention are intended to be illustrative only. Numerous alternative embodiments may be devised by those skilled in the art without departing from the scope of the following claims.

What is claimed is:

1. A method for erasing flash memory comprising the steps of:
   setting a critical ending condition;
   erasing selected multiple sectors of the flash memory simultaneously;
   utilizing a first counter to track the number of erasing actions performed, wherein the first counter is used to indicate when to verify if one of the selected multiple sectors meets the critical ending condition;
   utilizing a second counter to track the number of failures, wherein the second counter is used to indicate a time-out signal;
   stopping simultaneous erasing if one of the selected multiple sectors meets the critical ending condition; and
   erasing the remainder of each of the selected multiple sectors sequentially.

2. The method of claim 1, further comprising the step of resetting a flag which represents that the critical ending condition is met.

3. The method of claim 1, further comprising the step of recording the erasing status when the critical ending condition is met.

4. The method of claim 3, wherein the erasing status includes the voltage potential and the number of erasing actions performed.

5. The method of claim 1, wherein the critical ending condition is a passing rate of bits in the flash memory.

6. The method of claim 5, wherein if the first counter reaches a predetermined value, then all bits of one sector are verified to determine a passing rate.

7. A method for erasing flash memory comprising the steps of:
   erasing selected multiple sectors of the flash memory simultaneously;
   verifying bits of one sector upon a predetermined condition;
   continually erasing selected multiple sectors of the flash memory simultaneously if the verification does not satisfy a critical ending condition;
   utilizing a first counter to track the number of erasing actions performed, wherein the first counter is used to indicate the predetermined condition;
   utilizing a second counter to track the number of failures, wherein the second counter is used to indicate a time-out signal;
   stopping simultaneous erasing if the verification satisfies the critical ending condition; and
   erasing the remainder of each of the selected multiple sectors sequentially if the verification satisfies the critical ending condition.

8. The method of claim 7, further comprising the step of resetting a flag which represents that the critical ending condition is met.

9. The method of claim 7, wherein the critical ending condition is a passing rate of bits in the flash memory.

* * * * *